United States Patent [19]
Li

[11] Patent Number: 4,521,728
[45] Date of Patent: Jun. 4, 1985

[54] METHOD AND A SIX PORT NETWORK FOR USE IN DETERMINING COMPLEX REFLECTION COEFFICIENTS OF MICROWAVE NETWORKS

[75] Inventor: Shihe Li, Quebec, Canada
[73] Assignee: Renato Bosisio, Mont-Royal, Canada
[21] Appl. No.: 410,856
[22] Filed: Aug. 23, 1982
[51] Int. Cl.$^3$ .............................................. G01R 27/04
[52] U.S. Cl. ............................ 324/58 R; 324/58.5 R
[58] Field of Search ............... 324/58 R, 58 A, 58 B, 324/58 C, 58.5 R, 58.5 A, 58.5 B, 58.5 C

[56] References Cited
U.S. PATENT DOCUMENTS
4,104,583 8/1978 Engen ............................... 324/58 A OTHER PUBLICATIONS
Hoer: "A Network Analyzer Incorporating Two Six-Port Reflectometers", IEEE Trans. on MTT—vol. 25—No. 12—pp. 1070–1074, Dec. 1977.

Primary Examiner—Stanley T. Krawczewicz
Assistant Examiner—Jose M. Solis
Attorney, Agent, or Firm—Robic, Robic & Associates

[57] ABSTRACT

A six port network for use in determining a complex reflection coefficient associated with a microwave network. A directional coupler is connected between first and second ports of the six port network for transmitting microwave energy from a microwave source connected to the first port, to the microwave network connected to the second port. This coupler provides two signals respectively representative of the microwave energy supplied to the first port, and of the transmitted microwave energy reflected at the microwave network. The six port network further comprises a microwave circuit for producing from the two representative signals, four microwave power readings respectively associated with third, fourth, fifth and sixth ports of the six port network and proportional to $|a|^2$, $|1+\alpha e^{j\phi}\Gamma|^2$, $|1+\alpha e^{j(\phi+120°)}\Gamma|^2$ and $|1+\alpha e^{j(\phi-120°)}\Gamma|^2$ respectively, wherein $\Gamma$ is the complex reflection coefficient, $\alpha$ is a constant representing a calibrated parameter of the six port network, $\phi$ is an arbitrary phase angle and $<<a>>$ is the amplitude of the microwave signal supplied to the first port. The six port network may be used as an intelligent reflectometer and in a computer aided measurement system.

31 Claims, 7 Drawing Figures

LP : Low pass filter

SDD: Schottky diode detector

METHOD AND A SIX PORT NETWORK FOR USE IN DETERMINING COMPLEX REFLECTION COEFFICIENTS OF MICROWAVE NETWORKS

The present invention relates to a simple, high performance, wide operating frequency band six port network which can be directly used in microwave laboratories and industries as an automatic and accurate microwave network analysis instrumentation for measuring a complex reflection coefficient.

The use of such a six port network as microwave network analysis instrumentation is already known and disclosed, by way of example, in the publication of G. F. Engen <<The six-port reflectometer: an alternative network analyzer>>, IEEE Trans., vol. MTT-25, no. 12, pp. 1075-1080, 1977. The use of such a six port network for measuring the scattering matrix of a multi-port microwave network, is also known and described in the publication of Shihe Li and R. G. Bosisio, <<The automatic measurement of N-port microwave junction by means of the six port technique>>, IEEE EEMTIC'81 DIGEST, pp. 176-180, September 1981.

The working principle of the known six port reflectometer is based on that an unknown complex reflection coefficient can be determined by four microwave power measurements and obtained at the intersection of three circles drawn from these four power measurements in the complex reflection coefficient plane. However, it has been proved that an ideal six port network used as a six port reflectometer, is one in which the distribution of the origins of the three above mentioned circles, in the complex reflection coefficient plane, is symmetrical, i.e. with a 120° phase shift between the origins, and at the same distance from the center of the unit circle of the complex reflection coefficient plane, within the whole operating frequency band (see the publication of G. F. Engen, <<An improved circuit for implementing the six-port technique of microwave measurements>>, IEEE Trans., vol. MTT-25, no. 12, pp. 1080-1083, 1977).

Heretofore, all the known six port networks are composed of 3 dB hydrid junctions, 0° phase power dividers and/or −6 dB directional couplers. This arrangement does not distribute the origins of the three circles symmetrically, i.e. 120° apart. Therefore, more ports (seven or eight ports) are often required to improve the properties of the six port network in a wide operating frequency band. Such a design leads to high cost and complex configuration. In addition more measurements and longer calculation times are required.

An object of the present invention is to provide a six port network design which is formed with directional couplers, power dividers and special hybrid junctions that can be easily manufactured by ordinary printed circuit technology, and which provides an ideal symmetrical location (120° apart) of the centers of the three mentioned circles.

More particularly, the present invention proposes a six port network for use in determining a complex reflection coefficient associated with a microwave network. This six port network comprises coupling means mounted between a first port and a second port of the six port network for transmitting microwave energy from a microwave source connected to the first port, to the microwave network, connected to the second port. These coupling means includes means for providing a first signal representative of the microwave energy supplied to the first port and a second signal representative of the transmitted microwave energy reflected at the microwave network. The six port network also comprises means for transforming the first and second signals into a first, second, third and fourth microwave power readings that can be used for calculating the value of the complex coefficient associated with the microwave network and for supplying said power readings to the third, fourth, fifth and sixth ports of the six port network respectively, said power readings being respectively proportional to $|a|^2$, $|1+\alpha e^{j\phi}\Gamma|^2$, $|1+\alpha e^{j(\phi+120°)}\Gamma|^2$ and $|1+\alpha e^{j(\phi-120°)}\Gamma|^2$, wherein $\Gamma$ is the complex reflection coefficient associated with the microwave network, $\alpha$ is a constant representing a calibrated parameter of the six port network, <<a>> is the microwave energy supplied to the first port, and $\phi$ is an arbitrary phase angle.

These four power readings are usable for determining with accuracy the complex reflection coefficient.

With the six port network of the present invention, the origins of the circles in the complex reflection coefficient plane, are advantageously distributed in a symmetrical fashion over a wide frequency band. This design, technique and principle can be used in any microwave frequency band (from very low frequencies less than 10 MHz to very high frequencies greater than 100 GHz).

The six port network according to the invention may further comprise means connected to the third, fourth, fifth and sixth ports for converting the first, second, third and fourth microwave power readings into first, second, third and fourth analog DC voltages, respectively. These four DC voltages are proportional to the respective output microwave power readings produced by the six port network. This feature of producing anglog DC voltages is convenient for some practical applications.

Another object of the present invention is to provide an intelligent six port reflectometer for connection to a measuring bus, typically a IEEE-488 bus and for use as an independant reflectometer, this measuring bus controlling the microwave source and being connected to control and processing instrumentation. This reflectometer comprises:

a six port network as defined above;

means for amplifying the first, second, third and fourth analog DC voltages for providing a first, second, third and fourth amplified analog DC voltages respectively;

means for multiplexing the four amplified analog DC voltages and for converting each of these voltages into digital data;

means for receiving and interfacing the digital data;

central processing unit means for controlling in accordance with a first part of a program stored in a permanent memory, the interfacing and receiving means, the multiplexing and converting means through the interfacing and receiving means, and a random access memory for storing the digital data into the random access memory;

the central processing unit means treating the stored digital data in accordance with a second part of the program stored into the permanent memory which takes into consideration the characteristics of the bus for providing data representative of the complex reflection coefficient; and second means controlled by the measuring bus and the central processing unit means for interfacing the central processing unit means with the measuring bus, which processing means, in accordance with a third part of the program stored into the permanent memory, decodes addresses and commands supplied through the second interfacing means from the measuring bus and transmits the representative data on the bus through the second interfacing means.

The second interfacing means includes an interface unit mounted between the central processing unit means and a bus driver connected to the measuring bus. The intelligent reflectometer may also comprise means mounted between the interface unit and the bus driver for converting the representative data into a first and a second analog signals representative of the complex reflection coefficient, which signals can be supplied to a printer or an oscilloscope for visualization.

A further object of the invention is to provide an intelligent reflectometer for connection with the measuring bus, typically an IEEE-488 bus, connected to control and processing instrumentation. In such an embodiment, the central processing unit means pre-treats the stored digital data in accordance with a second part of the program stored into the permanent memory for coding the stored digital data into a form acceptable by the measuring bus.

The second means controlled by the measuring bus and the central processing unit means, interfaces the central processing unit means with the measuring bus. The processing means, in accordance with a third part of the program stored into the permanent memory, decodes addresses and commands supplied through the second interfacing means from the measuring bus and transmits the coded data on the bus through the second interfacing means.

Still another object of the present invention is to provide a method for producing power readings used for determining a complex reflection coefficient associated with a microwave network. This method includes the steps of:

transmitting microwave energy from a microwave source to the microwave network through coupling means;

producng a first signal representative of the microwave energy supplied from the microwave source and a second signal representative of the transmitted microwave energy reflected at the microwave network, and supplying the first and second signals to a first and second output of the coupling means respectively; and transforming the first and second signals to provide first, second, third and fourth power readings that can be used for calculating the value of the complex coefficient associated with the microwave network.

The power readings are respectively proportional to $|a|^2$, $|1+\alpha e^{j\phi}\Gamma|^2$, $|1+\alpha e^{j(\phi+120°)}\Gamma|^2$ and $|1+\alpha e^{j(\phi-120°)}\Gamma|^2$, wherein $\Gamma$ is the complex reflection coefficient associated with the microwave network, $\alpha$ is a constant representing a calibrated parameter of the six port network, a is the microwave energy supplied from the microwave source and $\phi$ is an arbitrary phase angle.

This method may further comprise the step of converting the first, second, third and fourth microwave power readings into first, second, third and fourth analog DC voltages respectively.

A further object of the present invention, is to provide a method for processing the above-mentioned four analog DC voltages for producing data representative of the complex reflection coefficient, the data being subsequently transmitted to a measuring bus, typically a IEEE-488 bus, controlling the microwave source and being connected to control and processing instrumentation. This method comprises the steps of:

amplifying the first, second, third and fourth analog DC voltages for producing first, second, third and fourth amplified analog voltages, respectively;

multiplexing the four amplified analog DC voltages and converting these voltages into digital data;

receiving and interfacing the digital data;

controlling in accordance with a first part of a program, the receiving and interfacing step, the multiplexing and converting step, and a random access memory for storing the digital data into the random access memory;

processing the stored digital data in accordance with a second part of the program which takes into consideration the characteristics of the bus for providing data representative of the complex reflection coefficient; and interfacing and decoding addresses and commands from the bus and transmitting the representative data on the bus, in accordance with a third part of the program.

This method further comprises the step of converting the representative data into a first and a second analog signals representative of the complex reflection coefficient, which signals can be supplied to an oscilloscope or printer for visualization.

In a preferred embodiment of the invention, the method produces data representative of the four DC voltages. In this case, the processing step treats the stored digital data in accordance with a second part of the program for coding the stored data into a form acceptable by the measuring bus. This method also includes the steps of interfacing and decoding addresses and commands from the bus and transmitting the coded data on the bus, in accordance with a third part of the program.

The objects, advantages and other features of the present invention will become more apparent from the following non-restrictive description of a preferred embodiment thereof, made in connection with the accompanying drawings, wherein.

Figure 1:
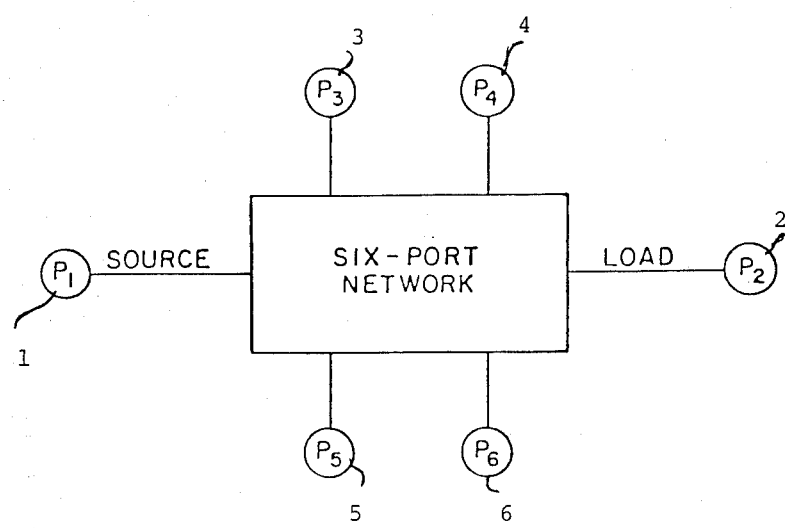
FIG. 1 represents a schematic, principle diagram of a six-port network according to the invention.

FIG. 1 shows the principle diagram of a six-port network. In this figure, $P_3$, $P_4$, $P_5$ and $P_6$ represent the four power readings at the four measurement ports 3, 4, 5 and 6. A microwave source is connected to port 1 and the load to be tested to port 2.

For a linear six-port microwave network as illustrated on FIG. 1, the basic relationships between its network parameters and the power readings can be expressed as follows:

$$p_i = \frac{P_{i+3}}{P_3} = q_i \left| \frac{1 + A_i \Gamma}{1 + A_o \Gamma} \right|^2 \quad (1)$$

where:

i = 1, 2 and 3;

$\Gamma$ is the unknown complex reflection coefficient to be determined and defined by the expression $\Gamma = |\Gamma|e^{j\theta} = X + jY$;

$P_3$ to $P_6$ are the four above mentioned power readings;

$q_1$ to $q_3$ represents three scalar parameters; and $A_o$ to $A_3$ are four complex parameters.

The four complex parameters $A_o$ to $A_3$ are defined within the following expressions:

$$A_o = a_o e^{j\phi_o} = a_o + jb_o \text{ and}$$

$$A_i = a_i e^{j\phi_i} = a_i + jb_i \quad (2)$$

wherein i = 1, 2 and 3

The three scalar parameters $q_1$ to $q_3$ and the four complex parameters $A_o$ to $A_3$ for a given six port network are determined via a calibration procedure. After the calibration has been carried out, the unknown complex reflection coefficient $\Gamma$ can be determined by the following linear combination of the power readings:

$$X = \frac{U_o + \sum_{i=1}^{3} U_i p_i}{1 + \sum_{i=1}^{3} C_i p_i} \quad (3)$$

$$Y = \frac{V_o + \sum_{i=1}^{3} V_i p_i}{1 + \sum_{i=1}^{3} C_i p_i}$$

wherein as indicated above X and Y are respectively the real and imaginary part of the complex reflection coefficient $\Gamma = X + jY$ and $p_i$ the values obtained form equation (1).

The eleven scalar parameters $C_1$ to $C_3$, $U_o$ to $U_3$ and $V_o$ to $V_3$ are calculated from the calibrated values $q_1$ to $q_3$ and $A_o$ to $A_3$. This relationship and the related calibration procedure are well known and described in detail in the article of Shihe Li and R. G. Bosisio, <<Calibration of Multi-port Reflectometer by means of four short/open circuits>>, IEEE Trans., vol. MTT-30, no. 7 pp. 1085-1090, 1982.

Figure 2:
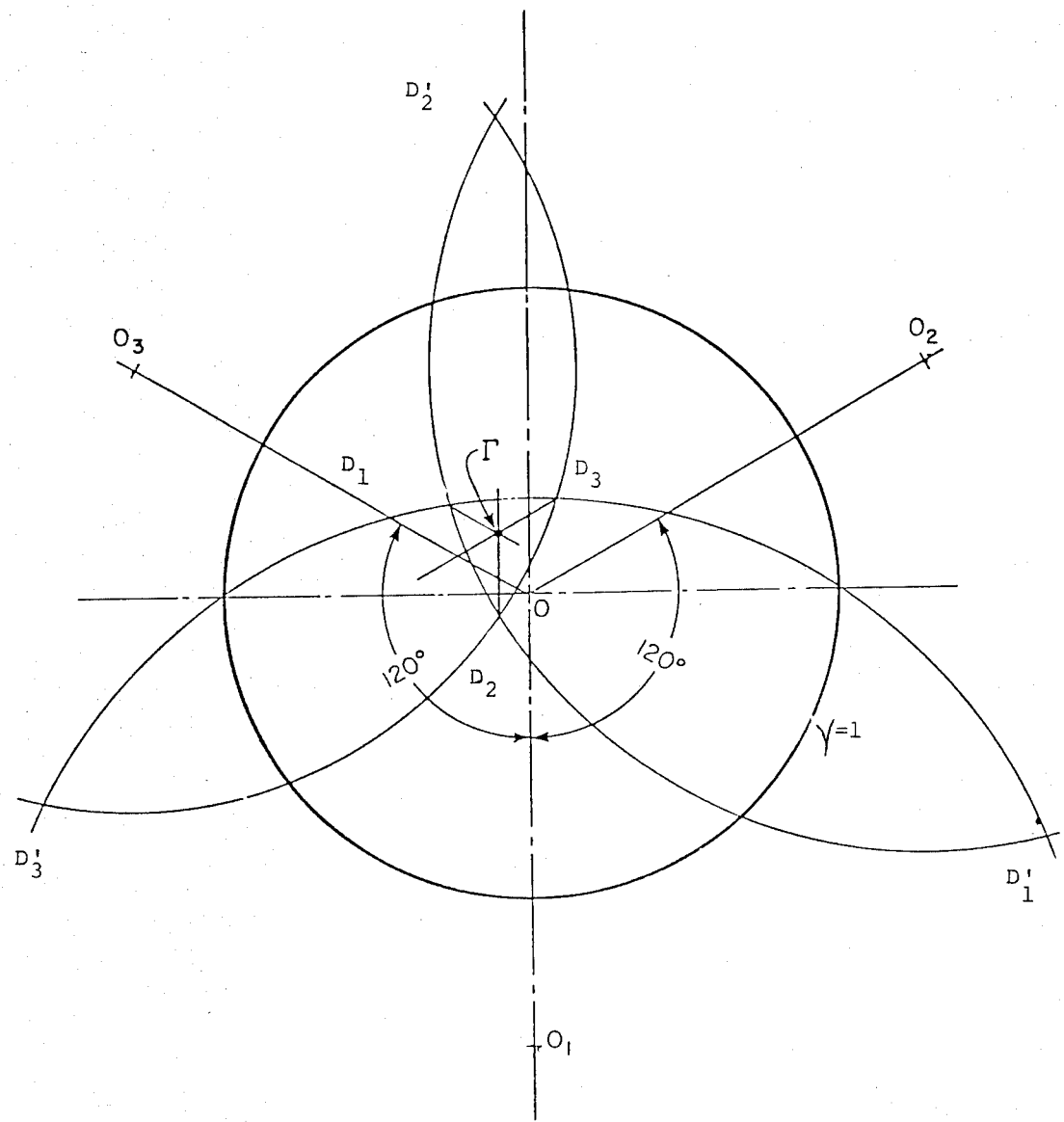
FIG. 2 is a diagram drawn in the complex reflection coefficient plane for illustrating the principle of determination of an unknown complex reflection coefficient by means of a six-port reflectometer in accordance with the present invention.

Geometrically, equation (1) is the equation of a circle in the complex reflection coefficient plane. The value of the reflection coefficient $\Gamma$ is therefore determined by the common intersection of the three circles deduced from equation (1) in the $\Gamma$ plane. More particularly, FIG. 2 shows the three above-mentioned circles where points $O_1$, $O_2$ and $O_3$ are the origins of these three circles, the positions of which are determined by the six-port design. Because of power measurement error, these three circles never intersect at a common point in the $\Gamma$ plane. However, solution of equation (3) gives the common intersection of three straight lines drawn from points $D_1$, $D_1'$, $D_2$, $D_2'$, $D_3$, $D_3'$ at the intersections on any pair of respective circles drawn from equation (1).

It has been suggested in the publication of G. F. Egen, <<An improved circuit for implementing the six-port technique of microwave measurements>>, IEEE Trans., vol. MTT-25, no. 12, pp. 1080–1083, 1977, and proved by a computer simulation procedure made by the inventor that the most accurate measurements can be obtained only when the three origins $O_1$, $O_2$ and $O_3$ in FIG. 2 are distributed to produce a perfect symmetry in both phase (every 120° apart as shown on FIG. 2) and to make the distances $OO_1$, $OO_2$ and $OO_3$ equal ($OO_1 = OO_2 = OO_3$ in FIG. 2). In the $\Gamma$ plane, $\gamma = 1$ defines the unit circle.

In other words, it is necessary to have the following network parameters in equation (1) to obtain the symmetry illustrated on FIG. 2 and to obtain a better accuracy of the measurement of $\Gamma$.

$$A_o = 0$$

$$a_1 = a_2 = a_3$$

$$\phi_2 = \phi_1 + 120°$$

$$\phi_3 = \phi_1 - 120° \quad (4)$$

wherein $\alpha_1$, $\alpha_2$, $\alpha_3$, $\phi_1$, $\phi_2$ and $\phi_3$ are defined within the following relationship already mentioned above:

$$A_i = a_i e^{j\phi_i}, \text{ i being equal to 1, 2 and 3.}$$

Figure 3:
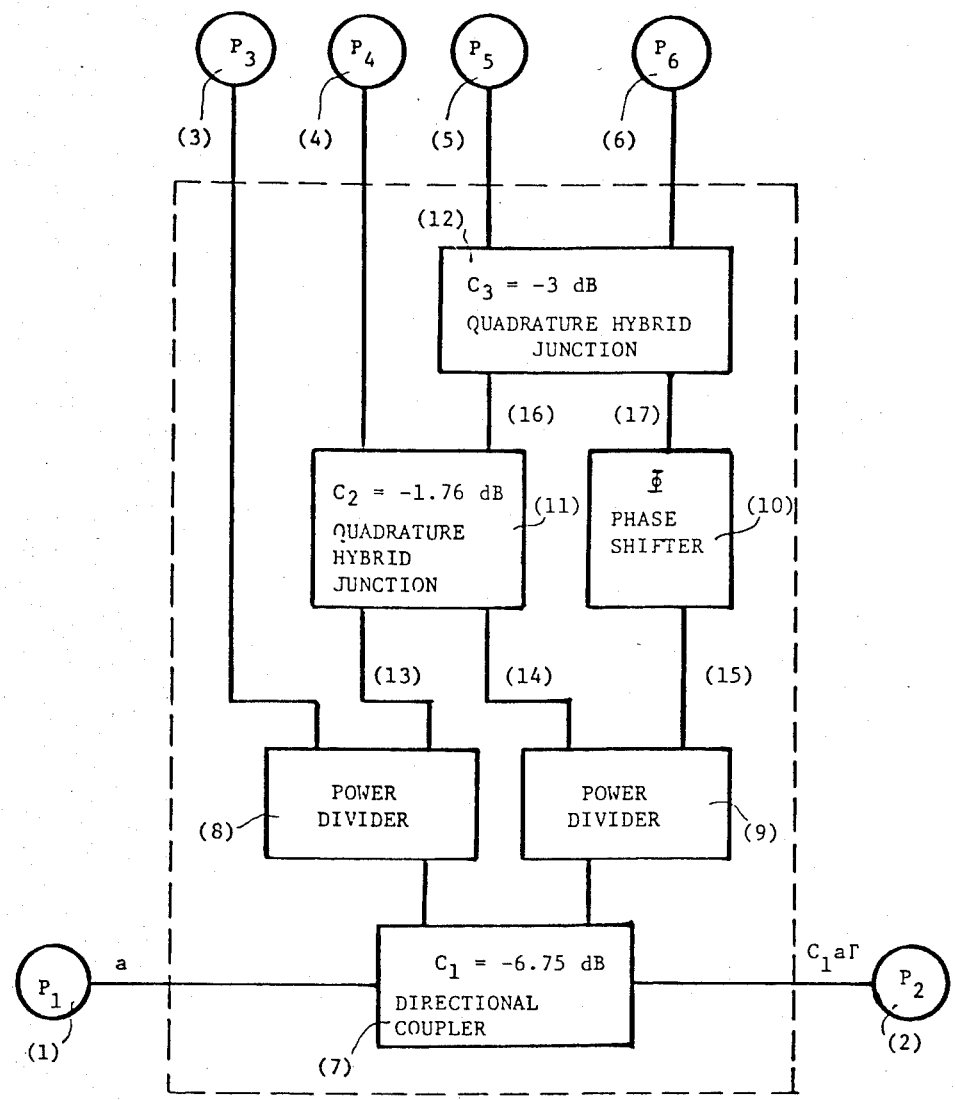
FIG. 3 is a block-diagram of an example of embodiment of the six-port network according to the present invention.

In an embodiment of the present invention, these optimum six port parameters are realized as illustrated by the block-diagram of FIG. 3 wherein there is provided a $-6.75$ dB = $C_1$ directional coupler (7), two in phase power dividers (8) and (9), a $-1.76$ dB = $C_2$ quadrature hybrid junction (11), a phase shifter (10), and a regular $-3$ db = $C_3$ quadrature hybrid junction (12). The four power readings measured at port 3 to 6 show that the required origin distribution in the $\Gamma$ plane is symmetrical.

The $-6.75$ dB directional coupler (7) couples a part of input microwave signal <<a>> from a microwave signal source to port 2. A part of this transmitted energy $C_1 a \Gamma$ is reflected from a microwave network connected to port 2. Then, the input voltage of the two power dividers (8) and (9) are respectively $\sqrt{1-C_1^2} \cdot a$ for (8) and $C_1 \sqrt{1-C_1^2} \cdot a \Gamma$ for (9). These two power dividers are both of $-3$ dB in amplitude and 0° in phase, so that the measured power $P_3$ is proportional to $|a|^2$ only, or $A_o = 0$; and the voltages at points (13), (14) and (15) are respectively $$\sqrt{\frac{1-C_1^2}{2}} \cdot a, \quad C_1 \sqrt{\frac{1-C_1^2}{2}} a \Gamma, \text{ and } C_1 \sqrt{\frac{1-C_1^2}{2}} a \Gamma.$$

The hybrid junction (11) is specially designed with 90° phase difference and $C_2 = -1.76$ dB coupling. Therefore the power reading at port (4) is $P_4 \propto |1 + \alpha_1 e^{-j90°} \Gamma|^2$, where $$\alpha_1 = \frac{C_1 C_2}{\sqrt{1-C_2^2}}.$$

The inputs of the ordinary $-3$ dB hybrid junction (12) and $-jC_2 + \sqrt{1-C_2^2} C_1 \Gamma$ (at point 16) and $C_1 \Gamma$ (at point 17, i.e. at the output of the phase balance circuit 10), wherein the common amplitude and phase factors have been omitted for simplification. Then the measured power readings $P_5$ and $P_6$ are $$P_5 \propto \left| 1 + \frac{C_1}{C_2} \Gamma(1 + j\sqrt{1 - C_2^2}) \right|^2 = |1 + a_2 e^{j\phi_2}\Gamma|^2$$

$$P_6 \propto \left| 1 + \frac{C_1}{C_2} \Gamma(-1 + \sqrt{1 - C_2^2}) \right|^2 = |1 + a_2 e^{j(\pi - \phi_2)}\Gamma|^2$$

An optimum six-port needs $a_1 = a_2$ and $\phi_2 = 30°$ to obtain the desired distribution of the origins of the circles. Obviously these two conditions can be satisfied by setting $C_2 = 0.8165$ (−1.76 dB coupling) only, and the absolute value of $a = a_1 = a_2 = a_3$ then equal to $\sqrt{2}C_1$. As mentioned above, and shown in FIG. 3, the −6.75 dB directional coupler (7) has a coupling coefficient $C_1 = 0.4597$ (−6.75 dB coupling); therefore the amplitude of each network parameter $a_1$, $a_2$ and $a_3$ is equal to 0.65 in the embodiment of FIG. 3, and it can be changed easily according to the required value of these parameters.

A plurality of six port networks as defined above can be used in a microwave network analyzer for automatically measuring the scattering mattrix of any microwave network by providing an appropriate computer software.

Figure 4:
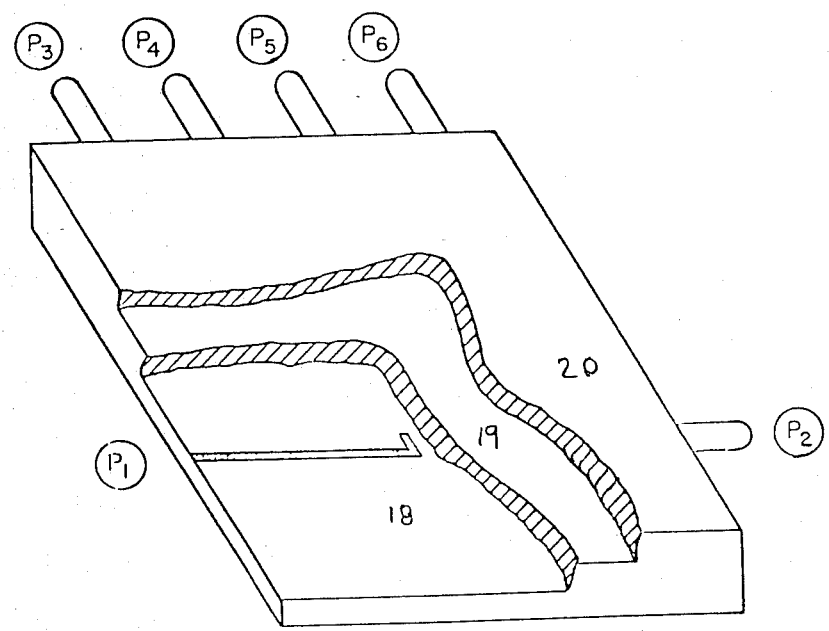
FIG. 4 represents an example of construction of the six port network of FIG. 3.

A structural embodiment of the six port network of FIG. 3 is shown in FIG. 4 wherein (18) and (20) are two printed microwave circuits separated by an appropriate dielectric sheet (19). More particularly, this network is formed with two microwave substracts (18) and (20) typically LX-062-17 of 3M Company (Trademark) with a lowloss teflon film (19) to separate these two boards with an appropriate isolation.

Figure 5:
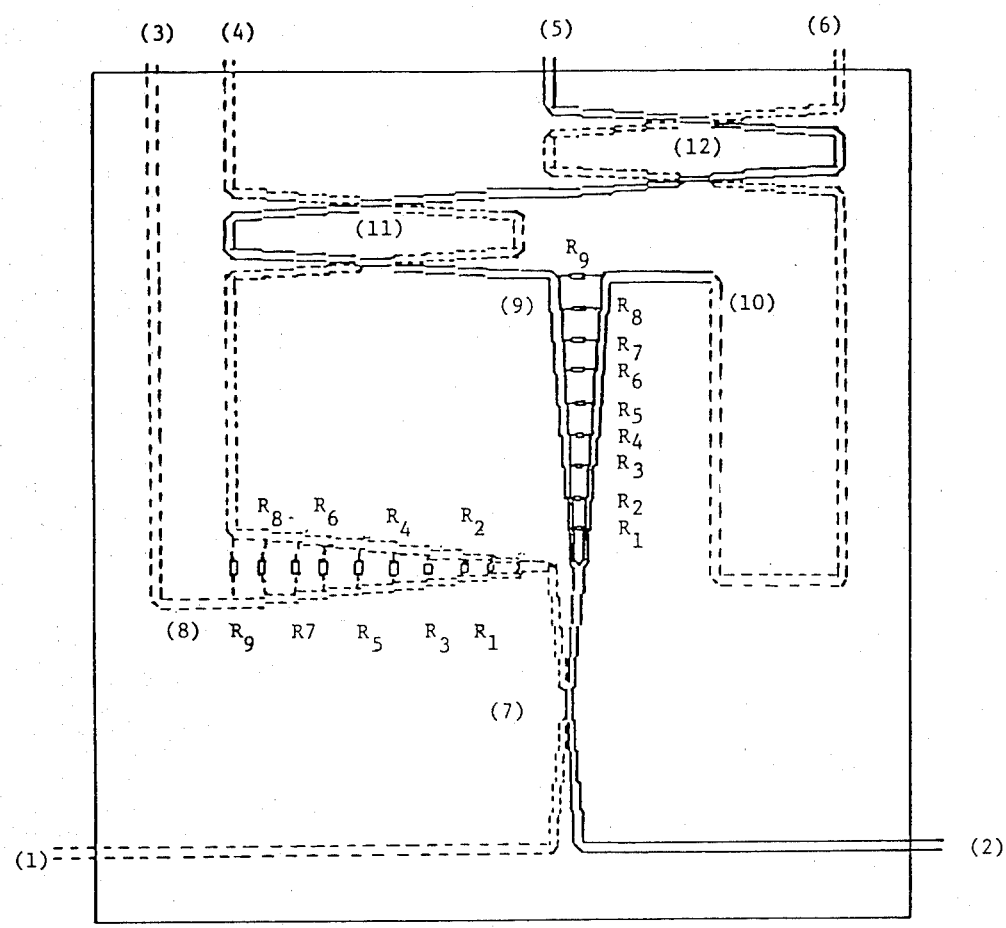
FIG. 5 is a schematic diagram of the microstrip line circuit of the embodiment of FIG. 4.

The microwave circuit layout of both the bottom (18) and top (20) boards are shown in FIG. 5, where the solid lines are on the top board and the dashed lines are on the bottom board. In this design, all directional couplers are symmetric broad-band couplers. Coupler (7) is set at −6.75 dB; hybrid junction (11) is a tandem of two −6.75 dB directional couplers to form a 31 1.76 dB hybrid junction, and regular −3 dB hybrid junction (12) is formed from a tandem of two −8.34 dB directional couplers. The two power dividers (8) and (9) are the same sections of Wilkinson type of 3 dB in phase divider. $R_1$, $R_2$, $R_3$, $R_4$, $R_5$, $R_6$, $R_7$, $R_8$ and $R_9$ are resistive elements used with the power dividers (8) and (9). The phase shifter (10) is embodied as illustrated. All components in FIG. 5 are designed such that the operation frequency band is at least 9:1.

The structural embodiments of the present invention are made by means of ordinary printed circuit technology, the only adjustment required is to ensure that the top and bottom board coincide perfectly.

Figure 6:
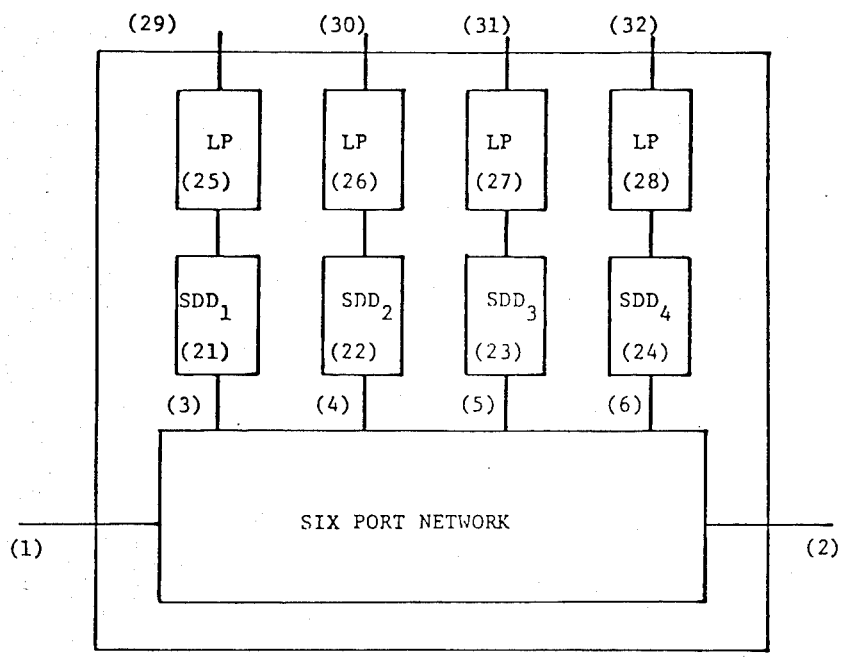
FIG. 6 is a block-diagram of a six-port network of the invention producing DC analogic voltage outputs.

The output at the third, fourth, fifth and sixth port of the embodiment of the present invention are microwave power readings useful for microwave power measurement. This is the first output format of the present invention. The embodiment in FIG. 3 may be developed to the structure of FIG. 6, wherein four zero bias Schottky diode detectors 21 to 24 each in series with a corresponding low-pass filter 25 to 28 are provided. This construction of FIG. 6 provides four DC analog voltages proportional to the related microwave powers.

Figure 7:
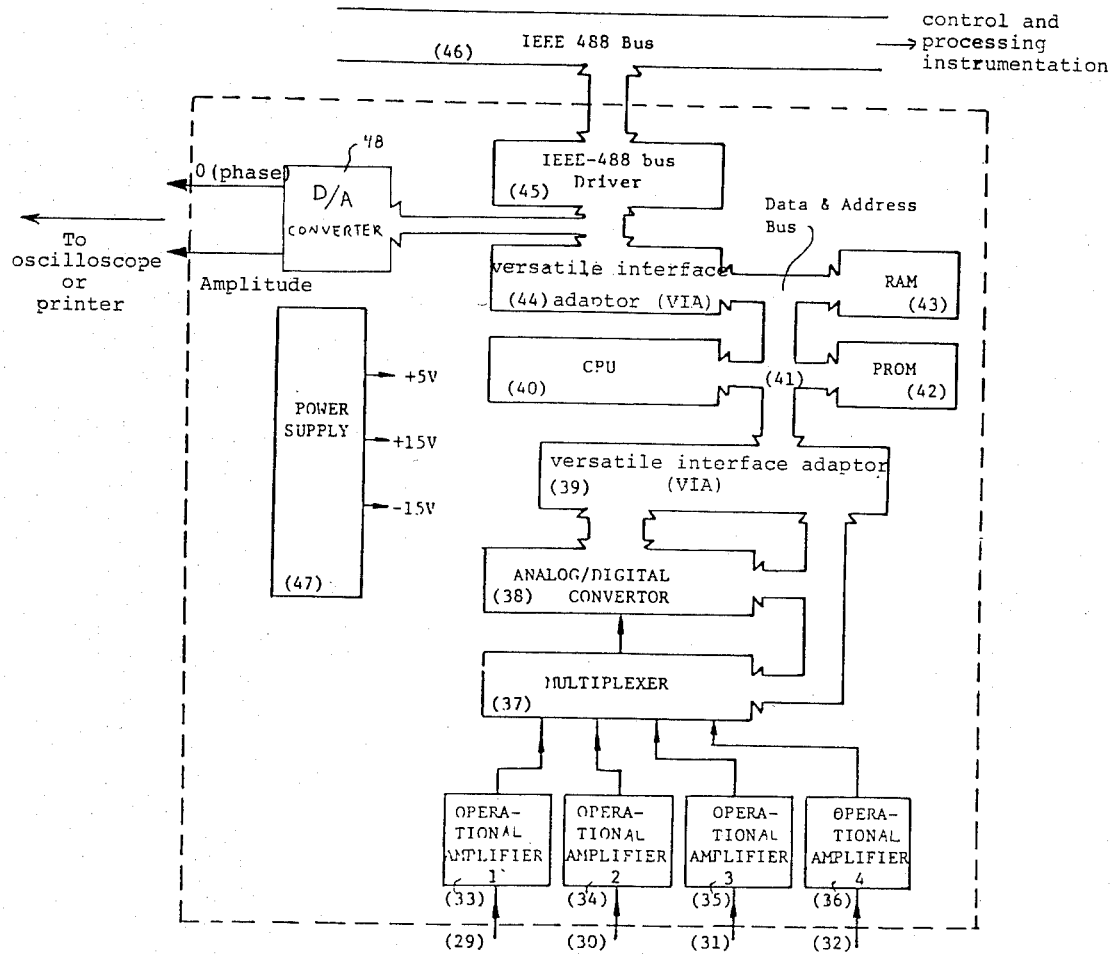
FIG. 7 is a block-diagram of an intelligent six port network according to the present invention.

For more convenience in using the present invention in an automated measurement system, FIG. 7 shows the block-diagram of an intelligent six-port network connected with a IEEE-488 bus (46) associated with control and processing instrumentation, which bus controlling the microwave source connected to port 1 of the six port network. The four analog voltages from terminals (29), (30), (31) and (32) of FIG. 6 have to be amplified by four high quality operational amplifier (33), (34), (35) and (36) respectively. The amplified DC analog voltages are then sequentially converted into digital data by an A/D converter (38) via a multiplexer (37). These digital data then enter a microprocessor's versatile interface adaptor (VIA) unit (39) and stored in the random acces memory (RAM) (43) via the data and address bus (41). All this data acquisition procedure is controlled by the central processing unit (CPU) chip (40) which may be constituted by a microprocessor and the program stored in PROM (42). On the other hand, the bus commands from the IEEE-488 bus (46) enter the bus driver (45) and are received by the CPU (40) via another VIA unit (44). All procedures of address and command decoding, handshake, pre-treatment of data into the related output format are accomplished by software stored in PROM 42.

As indicated herein above, a first part of the program stored in the programmable read-only memory (PROM) 42, controls the operation of the CPU 40 for controlling the A/D convertor 38 and the multiplexer 37 through the VIA 39, the VIA 39 itself and the RAM 43 for storing the digital data. A second part of the program controls the CPU 40 for pre-treating the stored digital data to convert them into a form acceptable by the bus 46 and a third part of the program permits the CPU 40 to decode the addresses and commands from the IEEE bus 46 and to transmit the converted data on the bus 46 through the VIA 44 and the driver 45. It is to be noted that the driver 45 and the VIA 44 are controlled by both the bus 46 for transmitting to the CPU 40 the addresses and commands and the CPU 40 for transmitting the coded data on the bus 46. In this embodiment, the D/A convertor 48 is removed because it is not usefull.

When the second part of the program stored in PROM 42 allows the CPU 40 to calculate itself the complex reflection coefficient from the stored digital data, a Digital/Analog converter 48 is provided for converting the data representative of the complex reflection coefficient at the output of the VIA 44 into a first and a second analogic signals representative of the phase and the amplitude of the complex coefficient respectively.

The representative data are transmitted on the bus and the first and second analogic signals are supplied to an oscilloscope or a printer for visualization.

The advantages of the present invention related to FIGS. 6 and 7 are (1) a fast response, as the DC voltages at (29), (30), (31) and (32) are always available, with less than 1 ms delay until stored in RAM (43); (2) a low cost as the microwave, analog, digital and microprocessor integrated circuits may be manufactured at a low cost compared with separate circuits and instruments of this type; (3) an interfacing to IEEE-488 bus by software, which simplifies the hardware and decreases the cost, more capacity may be added including a big buffer in RAM (43) and the possibility of pre-treatment of data, and more flexibility in software design.

As the present invention has been described with reference to preferred embodiments, it is to be understood that modifications to these embodiments within the scope of the following claims are not deemed to change the nature of the networks and reflectometers according to the above described invention.

What is claimed is:

1. A six port network for use in determining a complex reflection coefficient associated with a microwave network, comprising:

coupling means mounted between a first port and a second port of the six port network for transmitting microwave energy from a microwave source connected to the first port, to the microwave network connected to the second port, said coupling means including means for providing a first signal representative of the microwave energy supplied to the first port, and a second signal representative of the transmitted microwave energy reflected at the microwave network; and means for transforming said first and second signals into first, second, third and fourth microwave power readings that can be used for calculating the value of the complex coefficient associated with the microwave network and for supplying said power readings to third, fourth, fifth and sixth ports of the six port network, respectively, said power readings being respectively proportional to $|a|^2$, $|1+\alpha e^{j\phi}\Gamma|^2$, $|1+\alpha e^{j(\phi+120°)}\Gamma|^2$ and $|1+\alpha e^{j(\phi-120°)}\Gamma|^2$, wherein $\Gamma$ is the complex reflection coefficient associated with the microwave network, $\alpha$ is a constant representing a calibrated parameter of the six port network, a is the microwave energy supplied to said first port, and $\phi$ is an arbitrary phase angle.

2. The six port network of claim 1, wherein said transforming means comprises:

means for dividing the first signal thereby producing a first and a second divided signals, said first divided signal being the first power reading;

means for dividing the second signal thereby producing a third and a fourth divided signals;

first junction means responsive to the second and third divided signals for producing the second power reading and another output signal;

means for shifting the phase of the fourth divided signal thereby producing a phase-shifted signal; and second junction means responsive to the other output signal and to the phase-shifted signal for producing the third and fourth power readings.

3. The six port network of claim 2, wherein said coupling means is a −6.75 dB directional coupler.

4. The six port network of claim 2, wherein said means for dividing the first signal and said means for dividing the second signal are each constituted by a −3 dB in phase power divider.

5. The six port network of claim 2, wherein said first junction means is a −1.76 dB, 90° phase difference quadrature hybrid junction.

6. The six port network of claim 5, wherein said quadrature hybrid junction is formed with a tandem of two −6.75 dB directional couplers.

7. The six port network of claim 2, wherein said shifting means is a phase shifter.

8. The six port network of claim 2, wherein said second junction means is a regular −3 dB quadrature hybrid junction.

9. The six port network of claim 8, wherein said quadrature hybrid junction is a tandem of two −8.34 dB directional couplers.

10. The six port network of claim 2, wherein said six port network is formed with two printed microwave circuit separated by a lowloss dielectric sheet.

11. The six port network of claim 1, further comprising means connected to said third, fourth, fifth and sixth ports for converting said first, second, third and fourth microwave power readings into first, second, third and fourth analog DC voltages, respectively.

12. The six port network of claim 11, wherein said converting means comprises for each of the third, fourth, fifth and sixth ports, a SCHOTTKY diode detector connected in series with a low-pass filter.

13. An intelligent six port reflectometer for connection to a measuring bus and for use as an independent reflectometer, said measuring bus controlling a microwave source and being connected to control and processing instrumentation, said intelligent six port reflectometer comprising:

(a) a six port network for use in determining a complex reflection coefficient associated with a microwave network, comprising:

coupling means mounted between a first port and a second port of the six port network for transmitting microwave energy from said microwave source connected to the first port, to the microwave network connected to the second port, said coupling means including means for providing a first signal representative of the microwave energy supplied to the first port, and a second signal representative of the transmitted microwave energy reflected at the microwave network;

means for transforming said first and second signals into first, second, third and fourth microwave power readings that can be used for calculating the value of the complex coefficient associated with the microwave network and for supplying said power readings to third, fourth fifth, and sixth ports of the six port network, respectively, said power readings being respectively proportional to $|a|^2$, $|1+\alpha e^{j\phi}\Gamma|^2$, $|1+\alpha e^{j(\phi+120°)}\Gamma|^2$ and $|1+\alpha e^{j(\phi-120°)}\Gamma|^2$, wherein $\Gamma$ is the complex reflection coefficient associated with the microwave network, $\alpha$ is a constant representing a calibrated parameter of the six port network, a is the microwave energy supplied to said first port, and $\phi$ is an arbitrary phase angle; and means connected to said third, fourth, fifth and sixth ports for converting said first, second, third and fourth microwave power readings into first, second, third and fourth analog DC voltages, respectively;

(b) means for amplifying the first, second, third and fourth analog DC voltages for providing first, second, third and fourth amplified analog DC voltages, respectively;

(c) means for multiplexing the amplified analog DC voltages and for converting each of these amplified voltages into digital data;

(d) means for receiving and interfacing the digital data;

(e) central processing unit means for controlling in accordance with a first part of a program stored in a permanent memory, said interfacing and receiving means, said multiplexing and converting means through the interfacing and receiving means, and a random access memory for storing the digital data into the random access memory;

(f) said central processing unit means comprising means for treating the stored digital data in accordance with a second part of the program stored into the permanent memory which takes into consideration the characteristics of the bus for the purpose of providing data representative of the complex reflection coefficient; and (g) second means controlled by the measuring bus and the central processing unit means for interfacing the central processing unit means with the measuring bus, (h) said central processing unit means comprising means for, in accordance with a third part of the program stored into the permanent memory, decoding addresses and commands supplied through the second interfacing means from the measuring bus and transmitting said representative data on the bus through the second interfacing means.

14. An intelligent six port reflectometer for connection with a measuring bus controlling a microwave source and connected to control and processing instrumentation, comprising:

(a) a six port network for use in determining a complex reflection coefficient associated with a microwave network, comprising:

coupling means mounted between a first port and a second port of the six port network for transmitting microwave energy from said microwave source connected to the first port, to the microwave network connected to the second port, said coupling means including means for providing a first signal representative of the microwave energy supplied to the first port, and a second signal representative of the transmitted microwave energy reflected at the microwave network;

means for transforming said first and second signals into first, second, third and fourth microwave power readings that can be used for calculating the value of the complex coefficient associated with the microwave network and for supplying said power readings to third, fourth, fifth and sixth ports of the six port network, respectively, said power readings being respectively proportional to $|a|^2$, $|1+\alpha e^{j\phi}\Gamma|^2$, $|1+\alpha e^{j(\phi+120°)}\Gamma|^2$ and $|1+\alpha e^{j(\phi-120°)}\Gamma|^2$, wherein $\Gamma$ is the complex reflection coefficient associated with the microwave network, $\alpha$ is a constant representing a calibrated parameter of the six port network, a is the microwave energy supplied to said first port, and $\phi$ is an arbitrary phase angle; and means connected to said third, fourth, fifth and sixth ports for converting said first, second, third and fourth microwave power readings into first, second, third and fourth analog DC voltages, respectively;

(b) means for amplifying the first, second, third and fourth analog DC voltages for providing first, second, third and fourth amplified analog DC voltages respectively;

(c) means for multiplexing the amplified analog DC voltages and for converting each of these amplified voltages into digital data;

(d) means for receiving and interfacing the digital data;

(e) central processing unit means for controlling in accordance with a first part of a program stored in a permanent memory, said interfacing and receiving means, said multiplexing and converting means through the interfacing and receiving means, and a random access memory for storing the digital data into the random access memory;

(f) said central processing unit means comprising means for pre-treating the stored digital data in accordance with a second part of the program stored into the permanent memory for coding the stored digital data into a form acceptable by the measuring bus; and (g) second means controlled by the measuring bus and the central processing unit means for interfacing the central processing unit means with the measuring bus;

(h) said central processing unit means comprising means for, in accordance with a third part of the program stored into the permanent memory, decoding addresses and commands supplied through the second interfacing means from the measuring bus and transmitting said coded data on the bus through the second interfacing means.

15. The reflectometer of claim 13, wherein said second interfacing means includes an interface unit mounted between the central processing unit means and a bus driver connected to the measuring bus.

16. The reflectometer of claim 14, wherein said second interfacing means includes an interface unit mounted between the central processing unit means and a bus driver connected to the measuring bus.

17. The reflectometer of claim 15 or 16, wherein the measuring bus is a IEEE-488 bus, the interface unit is a versatile interface adaptor unit and the bus driver is a IEEE-488 bus driver.

18. The reflectometer of claim 15, further comprising means mounted between the interface unit and the bus driver for converting said representative data into a first and second analog signals representative of the complex reflection coefficient, and means for supplying said signals to an oscilloscope or a printer for visualization.

19. The reflectometer of claim 18, wherein the first and the second analog representative signals are representative of the phase and the amplitude of the complex reflection coefficient respectively.

20. The reflectometer of claim 13 or 14, wherein the amplifying means is constituted by four independent operational amplifiers.

21. The reflectometer of claim 13 or 14, wherein the multiplexing and converting means is a multiplexer and an analog to digital convertor, and the receiving and interfacing means is a versatile interface adaptor unit.

22. The reflectometer of claim 13 or 14, wherein the permanent memory is a programmable read only memory.

23. The reflectometer of claim 13 or 14, wherein the central processing unit means is a microprocessor.

24. The reflectometer of claim 18, wherein said converting means is a digital to analog converter.

25. A method for producing power readings used for determining a complex reflection coefficient associated with a microwave network, said method comprising the steps of:

transmitting microwave energy from a microwave source to the microwave network through coupling means;

producing a first signal representative of the microwave energy supplied from the microwave source, and a second signal representative of the transmitted microwave energy reflected at the microwave network and supplying said first and second signals to a first and a second output of the coupling means respectively; and transforming said first and second signals to provide first, second, third and fourth microwave power readings that can be used for calculating the value of the complex coefficient associated with the microwave network, said power readings being respectively proportional to $|a|^2$, $|1+\alpha e^{j\phi}\Gamma|^2$, $|1+\alpha e^{j(\phi+120°)}\Gamma|^2$ and $|1+\alpha e^{j(\phi-120°)}\Gamma|^2$, wherein $\Gamma$ is the complex reflection coefficient associated with the microwave network, $\alpha$ is a constant representing a calibrated parameter, a is the microwave energy supplied from the microwave source and $\phi$ is an arbitrary phase angle.

26. The method of claim 25, wherein the transforming step comprises the steps of:

dividing the first signal for producing a first and a second divided signals, said first divided signal being the first power reading;

dividing the second signal thereby producing a third and a fourth divided signals;

coupling by means of first junction means the second and third divided signals for producing the second power reading and another output signal;

shifting the phase of the fourth divided signal thereby producing a phase shifted signal; and coupling by means of second junction means said other output signal and the phase-shifted signal for producing the third and fourth power readings.

27. The method of claim 25, further comprising the step of converting the first, second, third and fourth microwave power readings into first, second, third and fourth analog DC voltages respectively.

28. A method for producing data representative of a complex reflection coefficient associated with a microwave network and for transmitting subsequently said representative data to a measuring bus controlling a microwave source and being connected to control and processing instrumentation, said method comprising the steps of:

transmitting microwave energy from the microwave source to the microwave network through coupling means;

producing a first signal representative of the microwave energy supplied from the microwave source, and a second signal representative of the transmitted microwave energy reflected at the microwave network, and supplying said first and second signals to a first and a second output of the coupling means, respectively;

transforming said first and second signals to provide first, second, third and fourth microwave power readings that can be used for calculating the value of the complex coefficient associated with the microwave network, said power readings being respectively proportional to $|a|^2$, $|1+\alpha e^{j\phi}\Gamma|^2$, $|1+\alpha e^{j(\phi+120°)}\Gamma|^2$ and $|1+\alpha e^{j(\phi-120°)}\Gamma|^2$, wherein $\Gamma$ is the complex reflection coefficient associated with the microwave network, $\alpha$ is a constant representing a calibrated parameter, a is the microwave energy supplied from the microwave source and $\phi$ is an arbitrary phase angle;

converting the first, second, third and fourth microwave power readings into first, second, third and fourth analog DC voltages respectively;

amplifying the first, second, third and fourth analog DC voltages for producing first, second, third and fourth amplified analog DC voltages respectively;

multiplexing the amplified analog DC voltages and converting each of these amplified voltages into digital data;

receiving and interfacing the digital data;

controlling in accordance with a first part of a program the receiving and interfacing step, the multiplexing and converting step, and a random access memory for storing the digital data into the random access memory;

processing the stored digital data in accordance with a second part of the program which takes into consideration the characteristics of the bus to provide said data representative of the complex reflection coefficient; and interfacing and decoding addresses and commands from the bus and transmitting said representative data on the bus, in accordance with a third part of the program.

29. A method for producing measuring data representative of a complex reflection coefficient associated with a microwave network and for subsequently transmitting said measuring data to a measuring bus, said bus controlling a microwave source and being connected to control and processing instrumentation, said method comprising the steps of:

transmitting microwave energy from the microwave source to the microwave network through coupling means;

producing a first signal representative of the microwave energy supplied from the microwave source, and a second signal representative of the transmitted microwave energy reflected at the microwave network, and supplying said first and second signals to a first and a second output of the coupling means, respectively;

transforming said first and second signals to provide first, second, third and fourth microwave power readings that can be used for calculating the value of the complex coefficient associated with the microwave network, said power readings being respectively proportional to $|a|^2$, $|1+\alpha e^{j\phi}\Gamma|^2$, $|1+\alpha e^{j(\phi+120°)}\Gamma|^2$ and $|1+\alpha e^{j(\phi-120°)}\Gamma|^2$, wherein $\Gamma$ is the complex reflection coefficient associated with the microwave network, $\alpha$ is a constant representing a calibrated parameter, a is the microwave energy supplied from the microwave source and $\phi$ is an arbitrary phase angle;

converting the first, second, third and fourth microwave power readings into first, second, third and fourth analog DC voltages respectively;

amplifying the first, second, third and fourth analog DC voltages for producing first, second, third and fourth amplified analog DC voltages, respectively;

multiplexing the amplified analog DC voltages and converting these amplified voltages into digital data;

receiving and interfacing the digital data;

controlling in accordance with a first part of a program the receiving and interfacing step, the multiplexing and converting step, and a random access memory for storing the digital data into the random access memory;

processing the stored digital data in accordance with a second part of the program for coding the stored data into a form acceptable by the measuring bus, said coded data constituting said measuring data; and interfacing and decoding addresses and commands from the bus and transmitting the coded data on the bus, in accordance with a third part of the program.

30. The method of claim 28, further comprising the step of converting said representative data into a first and second analog signals representative of the complex reflection coefficient, and means for supplying said signals to an oscilloscope or a printer for visualization.

31. The method of claim 30, wherein the first and second analog signals are representative of the phase and the amplitude of the complex reflection coefficient, respectively.

* * * * *